US010863659B2

(12) United States Patent
Iwaki et al.

(10) Patent No.: US 10,863,659 B2
(45) Date of Patent: Dec. 8, 2020

(54) WORK MACHINE

(71) Applicant: FUJI CORPORATION, Chiryu (JP)

(72) Inventors: Noriaki Iwaki, Hekinan (JP); Kazuya Degura, Toyota (JP)

(73) Assignee: FUJI CORPORATION, Chiryu (JP)

( * ) Notice: Subject to any disclaimer, the term of this patent is extended or adjusted under 35 U.S.C. 154(b) by 324 days.

(21) Appl. No.: 15/756,805

(22) PCT Filed: Sep. 4, 2015

(86) PCT No.: PCT/JP2015/075238
§ 371 (c)(1),
(2) Date: Mar. 1, 2018

(87) PCT Pub. No.: WO2017/037949
PCT Pub. Date: Mar. 9, 2017

(65) Prior Publication Data
US 2018/0271002 A1    Sep. 20, 2018

(51) Int. Cl.
H05K 13/08      (2006.01)
H05K 13/04      (2006.01)
H05K 13/00      (2006.01)
H05K 1/02       (2006.01)

(52) U.S. Cl.
CPC ......... H05K 13/08 (2013.01); H05K 13/0061 (2013.01); H05K 13/0473 (2013.01); H05K 13/0812 (2018.08); H05K 1/0269 (2013.01)

(58) Field of Classification Search
CPC .... G01R 31/01; H05K 13/0015; H05K 13/02; H05K 13/04; H05K 13/0409; H05K 1/0269; H05K 13/0061; H05K 13/0473; H05K 13/08; H05K 13/0812
See application file for complete search history.

(56) References Cited

U.S. PATENT DOCUMENTS

2002/0029486 A1    3/2002  Uchiyama et al.

FOREIGN PATENT DOCUMENTS

| JP | 62-158395 A  |   | 7/1987 |
| JP | 7-38293 A    |   | 2/1995 |
| JP | 07092190 A   | * | 4/1995 |

(Continued)

OTHER PUBLICATIONS

International Search Report dated Nov. 24, 2015 in PCT/JP2015/075238 filed Sep. 4, 2015.

(Continued)

Primary Examiner — Carl J Arbes
(74) Attorney, Agent, or Firm — Oblon, McClelland, Maier & Neustadt, L.L.P.

(57) ABSTRACT

In a component mounter, a cut and clinch unit is arranged below a circuit board that is conveyed by a conveyance device, and the cut and clinch unit can be moved to a given position by a moving device. When imaging a fiducial mark of the circuit board using an imaging device, the cut and clinch unit is moved such that an identification assistance sticker arranged on the cut and clinch unit is positioned as the background to the fiducial mark. The color of the circuit board surrounding the fiducial is white and the color of the identification assistance sticker is black. Thus, the outline of the fiducial mark is clear and the fiducial mark can be appropriately recognized based on the image data.

6 Claims, 7 Drawing Sheets

(56) References Cited

FOREIGN PATENT DOCUMENTS

| | | | |
|---|---|---|---|
| JP | 8-288695 | A | 11/1996 |
| JP | 2002-64296 | A | 2/2002 |
| JP | 2003-194522 | A | 7/2003 |
| JP | 2009-135295 | A | 6/2009 |
| JP | 4381867 | B2 * | 12/2009 |
| WO | 2012086310 | A1 * | 6/2012 |

OTHER PUBLICATIONS

Extended European Search Report dated May 24, 2018 in Patent Application No. 15903068.3, 7 pages.

* cited by examiner

WORK MACHINE

TECHNICAL FIELD

The present disclosure is related to a work machine for performing work with respect to a board.

BACKGROUND ART

With a work machine that performs work with respect to a board, conventionally, a board is conveyed to a work position by a conveyance device, and held at that position. Also, through-holes are formed in the board as fiducial marks, and the through-holes of the board held at the work position are imaged by an imaging device. Then, based on the image data, the positions of the through-holes are recognized, such that the holding position of the board is calculated, and then work is performed on the board based on the calculated holding position. Technology for calculating the holding position of a board based on image data of through-holes is disclosed in the patent literature below.

Patent literature 1: JP-A-H8-288695
Patent Literature 2: JP-A S62-158395
Patent literature 3: JP-A-2003-194522

SUMMARY

According to technology disclosed in the above patent literature, the position of a through-hole is recognized based on image data of the through-hole, making it possible to calculate the holding position of a board. However, there are cases in which it is not possible to appropriately recognize a through-hole based on image data because an outline of the through-hole is not clear, for example, in a case in which the color of the board surrounding the through-hole and the color of the background that is imaged through the through-hole are the same. The present disclosure takes account of such circumstances, and an object thereof is to appropriately recognize a through-hole based on image data.

To solve the above problems, a work machine of the present disclosure includes: a conveyance device configured to convey a board in which a through-hole is formed; an imaging device configured to image from above the board conveyed by the conveyance device; a moving device configured to move a moving body arranged below the board conveyed by the conveyance device to a given position; a control device including a movement control section configured to cause the moving device to move the moving body such that a background section arranged on the moving body is arranged as a background to the through-hole, when the through-hole of the board is imaged by the imaging device, and a calculating section configured to calculate a position of the board conveyed by the conveyance device based on image data of the through-hole of the board imaged by the imaging device.

With a work machine according to the disclosed disclosure, a moving body is arranged below a board conveyed by a conveyance device, and the moving body can be moved to a given position by a moving device. And, when a through-hole of the board is imaged using an imaging device, the moving body is moved such that a background section arranged on the moving body is positioned as a background to the through-hole. Accordingly, for example, by the color of the background section being different to the color of the board surrounding the through-hole, the outline of the through-hole becomes clear, and the through-hole can be appropriately recognized based on the image data.

DESCRIPTION OF PREFERRED EMBODIMENTS

Figure 1:
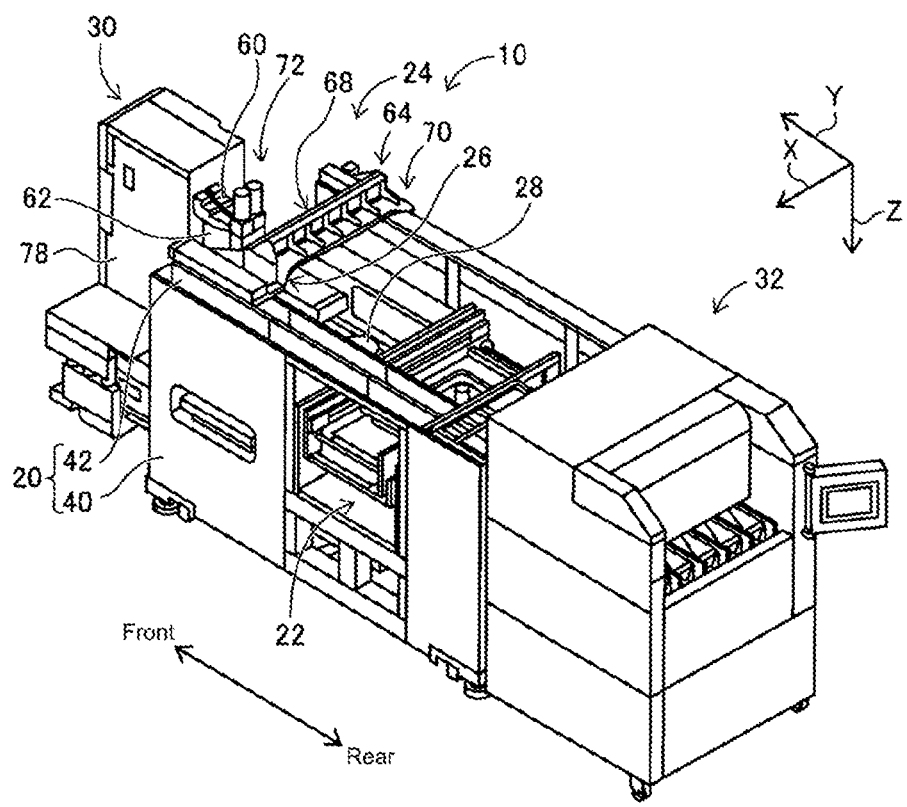
FIG. 1 is a perspective view of a component mounter.

The following describes in detail referring to the figures an example embodiment of the present disclosure.
Configuration of Component Mounter FIG. 1 shows component mounter 10. Component mounter 10 is for performing work of mounting components on a circuit board. Component mounter 10 is provided with device main body 20, board conveyance device 22, component mounting device 24, mark camera 26, component camera 28, component supply device 30, loose component supply device 32, cut and clinch device (refer to FIG. 4) 34, and control device (refer to FIG. 6) 36.

Figure 2:
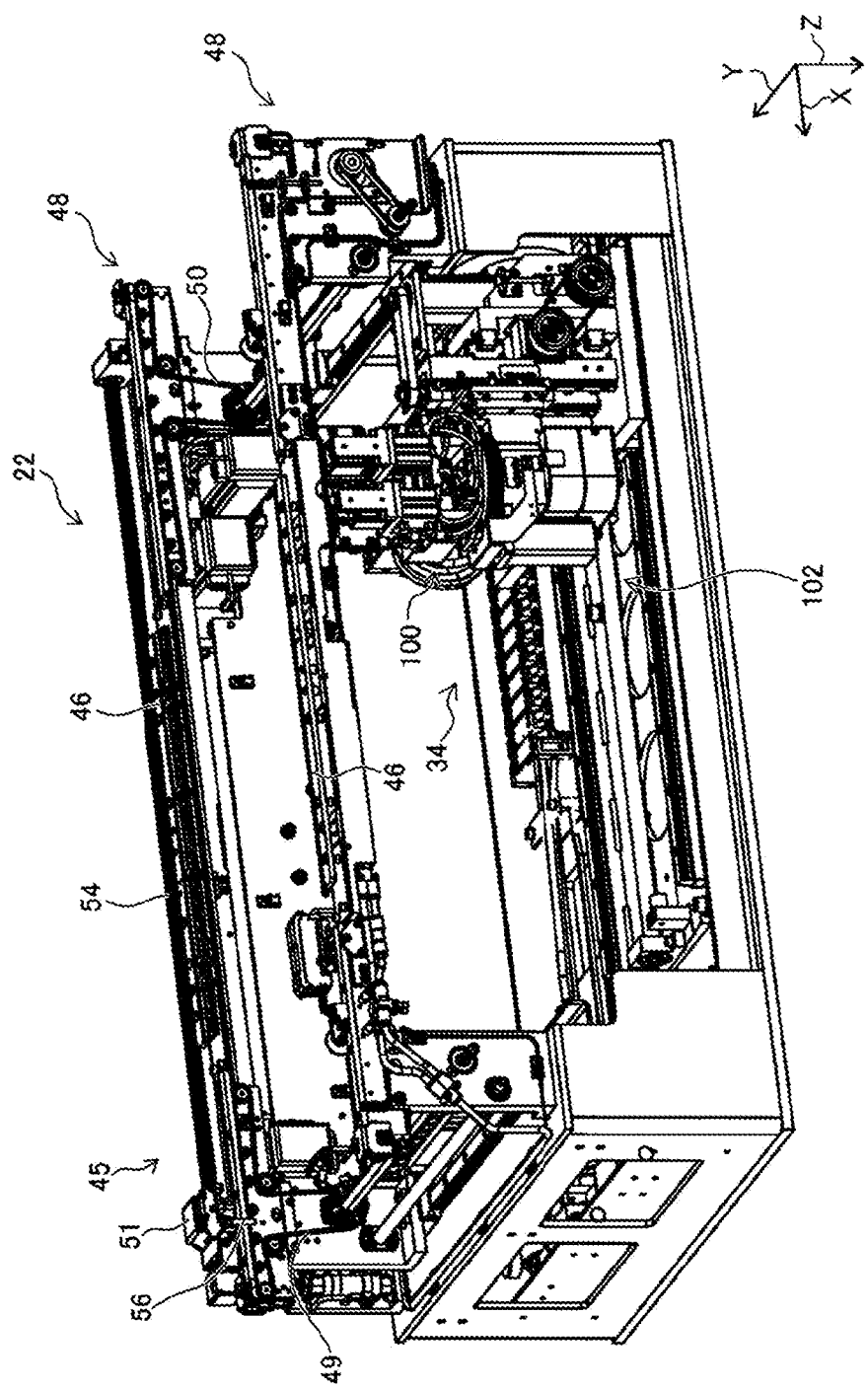
FIG. 2 is a perspective view of a conveyance device and a cut and clinch device.

Device main body 20 is configured from frame section 40 and beam section 42 that is mounted on the frame section 40. Conveyance device 22 is arranged in a central position in the front-rear direction of frame section 40, and as shown in FIG. 2, is provided with conveyor device 45 and clamp device 46. Conveyor device 45 includes a pair of rail holding sections 48, and the pair of rail holding sections 48 extend substantially horizontally and are arranged facing each other. Each rail holding section 48 includes first conveyor belt 49, second conveyor belt 50, and shuttle conveyance section 51. First conveyor belt 49 is arranged upstream of rail holding section 48, and is revolved by electromagnetic motor (refer to FIG. 6) 52. Second conveyor belt 50 is arranged downstream of rail holding section 48, and is revolved by electromagnetic motor (refer to FIG. 6) 53. Shuttle conveyance section 51 is slidably held on an upper end section of rail holding section 48 by rail 54 between a position above first conveyor belt 49 and a position above second conveyor belt 50. Further, shuttle conveyance section 51 is slid along rail 54 by electromagnetic motor (refer to FIG. 6) 55. Note that, pin 56 is arranged on a lower surface of shuttle conveyance section 51 extending downwards.

Also, clamp device 46 is arranged at an upper end section of rail holding section 48 between first conveyor belt 49 and second conveyor belt 50, and is movable in a vertical direction. Further, clamp device 46 is raised and lowered by operation of electromagnetic motor (refer to FIG. 6) 57. According to such a configuration, conveyance device 22 conveys a circuit board and clamps the circuit board at a specified position. In detail, a circuit board is loaded into component mounter 10, and is supported by first conveyor belt 49. Next, the circuit board is conveyed downstream by the revolving of first conveyor belt 49. Then, by shuttle conveyance section 51 being slid downstream, pin 56 of shuttle conveyance section 51 engages with the circuit board. Thus, the circuit board is conveyed from upstream to downstream of first conveyor belt 49, and is conveyed below clamp device 46. When the circuit board is conveyed below clamp device 46, clamp device 46 is lowered. This clamps the circuit board. Then, work is performed with respect to the clamped circuit board. When work on the circuit board is complete, clamp device 46 is raised to release clamping of the circuit board. Next, shuttle conveyance device 51 slides downstream, and the circuit board with which pin 56 is engaged is conveyed to above second conveyor belt 50. Then, by the revolving of second conveyor belt 50, the circuit board is unloaded from component mounter 10. Note that, the conveyance direction of the circuit board by conveyor device 45 is referred to as the X direction, the direction horizontally perpendicular to the X direction is referred to as the Y direction, and the vertical direction is referred to as the Z direction.

Also, one of the pair of rail holding sections 48 is able to move towards and away from the other pair of rail holding sections 48, with moving being performed by operation of electromagnetic motor (refer to FIG. 6) 58. That is, the distance between the pair of rail holding sections 48 can be changed freely. Thus, by changing the distance between the pair of rail holding sections 48 in accordance with dimensions of the circuit board, circuit boards with various dimensions can be conveyed.

Figure 3:
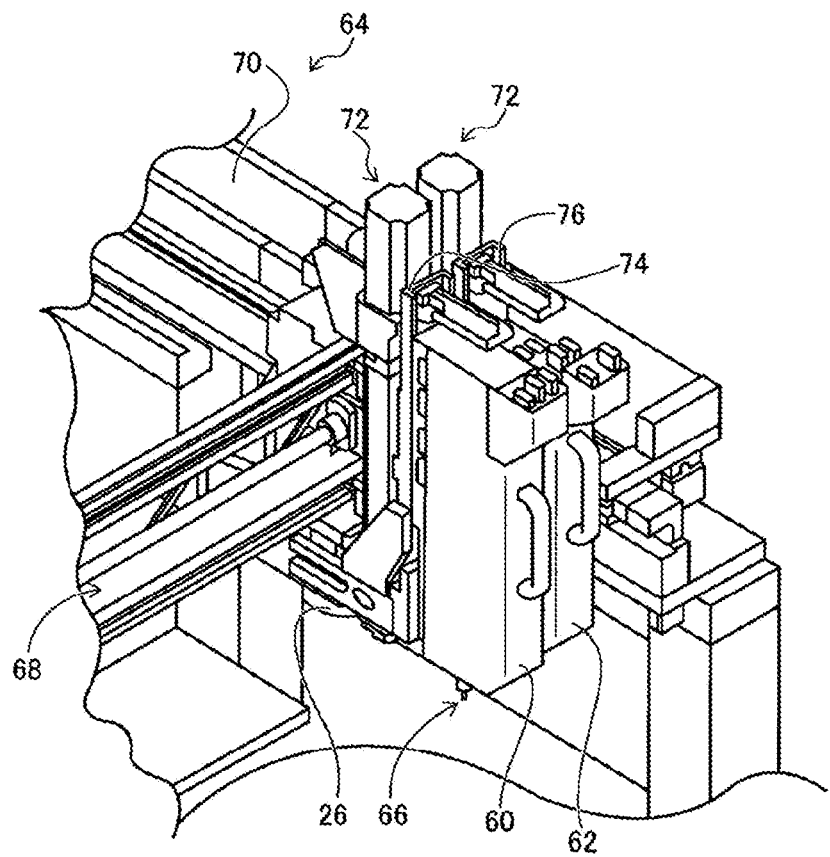
FIG. 3 is a perspective view of a component mounting device.
Figure 3:
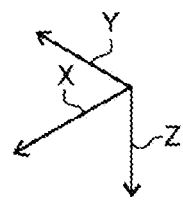

As shown in FIG. 1, component mounting device 24 includes beam section 42, two work heads 60 and 62, and work head moving device 64. As shown in FIG. 3, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveyance device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 6) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Figure 4:
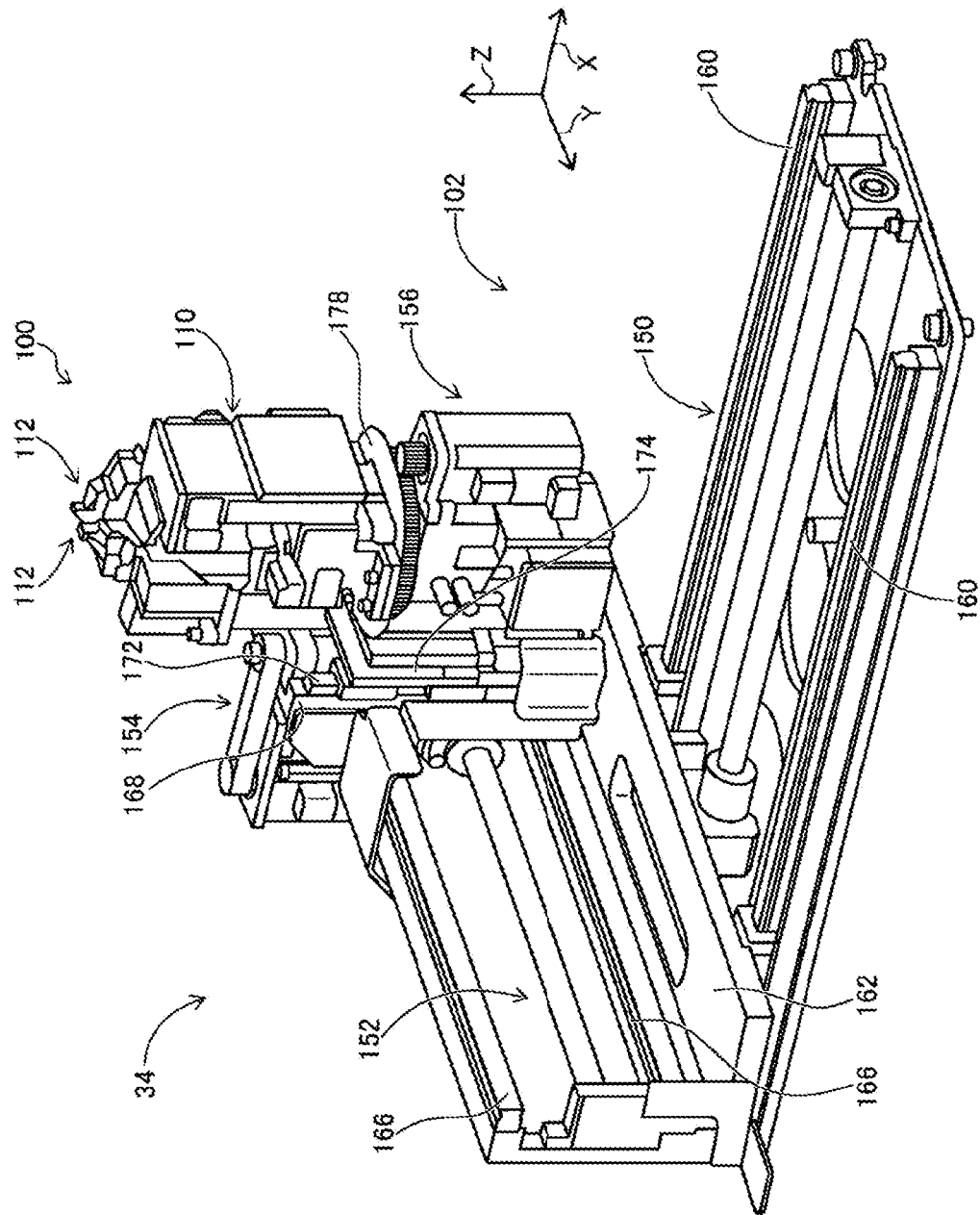
FIG. 4 is a perspective view of a cut and clinch device.
Figure 5:
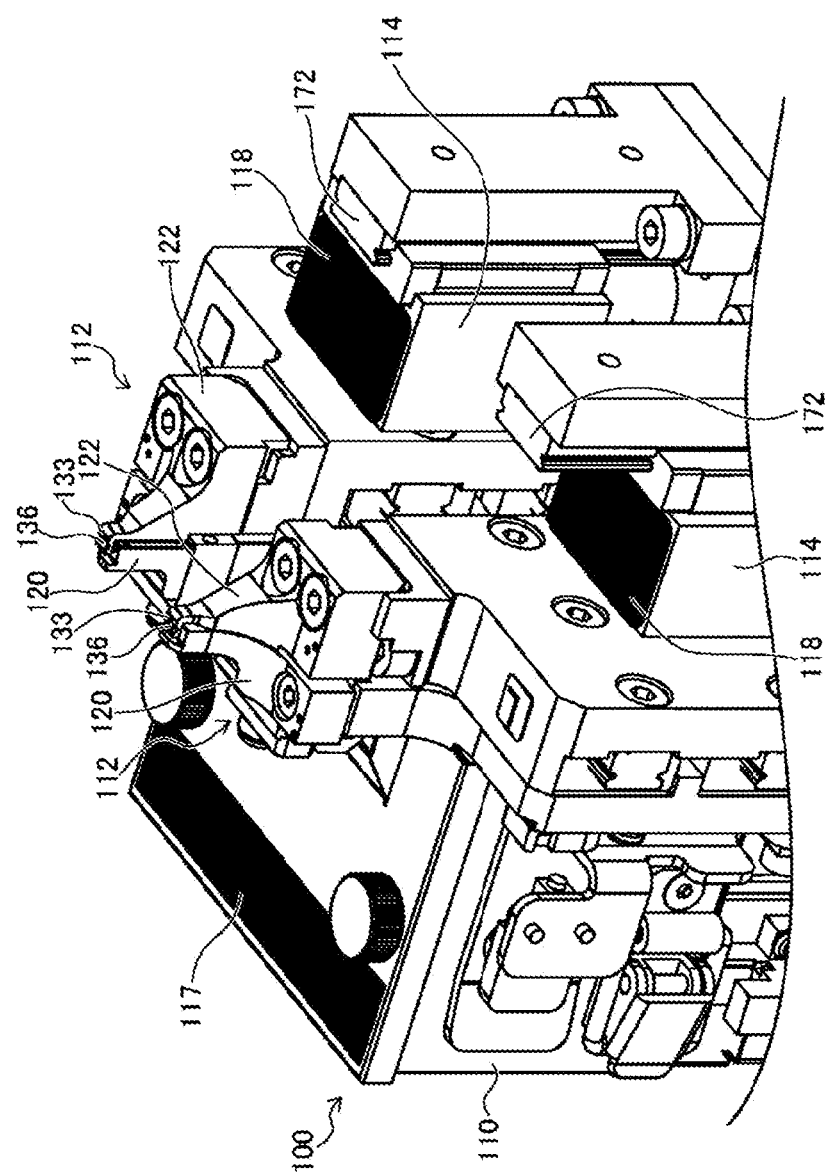
FIG. 5 is a perspective view of a cut and clinch unit.

As shown in FIG. 2, cut and clinch device 34 is arranged below conveyance device 22 and includes cut and clinch unit 100 and unit moving device 102. As shown in FIGS. 4 and 5, cut and clinch unit 100 includes unit main body 110, pair of slide bodies 112, and pair of supporting bodies 114. Unit main body 110 and pair of supporting bodies 114 are arranged facing each other and separated by a specified distance, with each supporting body 114 being fixed at a lower end section to unit main body 110. A pair of slide bodies 112 are arranged extending from an upper surface of unit main body 110 and supporting body 114 in a state sandwiched by unit main body 110 and supporting body 114, and are slidable in a direction towards and away from each other. Thus, by operation of electromagnetic motor (refer to FIG. 6) 116, the pair of slide bodies 112 moves towards and away from each other, such that the distance between them can be controllably changed.

Note that, an upper surface of unit main body 110 has a shaved metal surface, and identification assistance sticker 117 is affixed to cover a portion of the upper surface. Identification assistance sticker 117 is a black sticker. Also, an upper surface of supporting body 114 is also a shaved metal surface, and identification assistance sticker 118 is affixed to cover the entire upper surface. Similar to identification assistance sticker 117, identification assistance sticker 118 is also black.

Also, each of the pair of slide bodies 112, as shown in FIG. 5, includes main body section 120 and movable section 122. Movable section 122 is slidably held on main body section 120, and movable section 122 is controllably slid by operation of electromagnetic motor (refer to FIG. 6) 128. Also, an upper end section of main body section 120 is formed tapered towards the end, and a first insertion hole (not shown) is formed so as to pierce the upper end section in a vertical direction. Note that, the edge of the first insertion hole that opens to the upper end surface of main body section 120 is formed as a fixed blade.

Further, an upper end section of movable section 122 is also formed tapered towards the end, and L-shaped curved section 133 is formed at the upper end section of movable section 122. Curved section 133 extends upwards of the upper end surface of main body section 120, and there is slight clearance between curved section 133 and the upper end of main body section 120. And, the first insertion hole that opens at the upper end surface of main body section 120 is covered by curved section 133, and second insertion hole 136 is formed in curved section 133 so as to face the first insertion hole. Second insertion hole 136 pierces bent section 133 in a vertical direction and is connected to the first through-hole. Also, the edge of second insertion hole 136 that opens to the lower end surface of curved section 133 is formed as a movable blade.

Also, as shown in FIG. 4, unit moving device 102 includes X-direction moving device 150, Y-direction moving device 152, Z-direction moving device 154, and rotating device 156. X-direction moving device 150 includes a pair of slide rails 160 and X slider 162. Slide rail 160 extends in the X direction, and X slider 162 is slidably supported on X slide rail 160. X slider 162 moves in the X direction by the driving of electromagnetic motor (refer to FIG. 6) 164. Y-direction moving device 152 includes a pair of slide rails 166 and Y slider 168. Slide rail 166 is arranged on X slider 162 extending in the Y direction, and Y slider 168 is slidably supported on slide rail 166. Y slider 168 moves in the Y direction by the driving of electromagnetic motor (refer to FIG. 6) 170. Z-direction moving device 154 includes a pair of slide rails 172 (only one of which is shown) and Z slider 174. Slide rail 172 is arranged on Y slider 168 extending in the Z direction, and Z slider 174 is slidably supported on slide rail 172. Z slider 174 moves in the Z direction by the driving of electromagnetic motor (refer to FIG. 6) 176. Note that, as shown in FIG. 5, slide rail 172 extends to the rear surface side of cut and clinch unit 100. And, supporting bodies 114 of cut and clinch unit 100 are slidably supported by slide rail 172.

Further, rotating device 156 includes rotating table 178 that is roughly disc-shaped. Rotating table 178 is supported by Z slider 174 so as to be rotatable around its own center, and is rotated by the driving of electromagnetic motor (refer to FIG. 6) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotating device 156. Thus, second insertion hole 136 of cut and clinch unit 100 can be positioned at any position under a circuit board held by clamp device 46.

Figure 6:
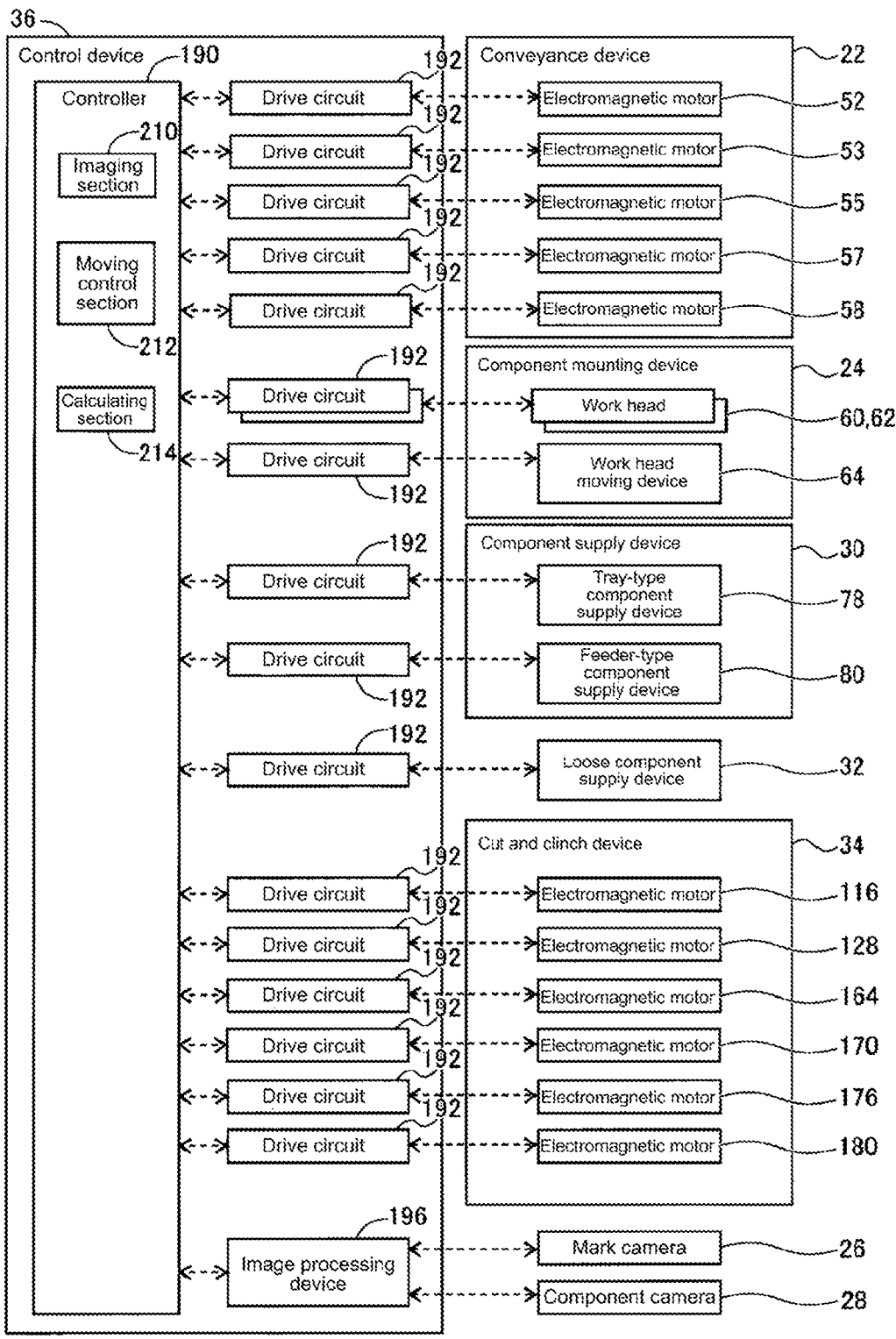
FIG. 6 is a block diagram showing a control device.

As shown in FIG. 6, control device 36 is provided with controller 190, multiple drive circuits 192, and image processing device 196. The multiple drive circuits 192 are connected to work heads 60 and 62, work head moving device 64, tray type component supply device 78, feeder type component supply device 80, loose component supply device 32, and electromagnetic motors 52, 53, 55, 57, 58, 116, 128, 164, 170, 176, and 180. Controller 190 is provided with a CPU, ROM, RAM, and so on, is formed mainly from a computer, and is connected to the multiple drive circuits 192. Thus, operation of items such as conveyance device 22 and component mounting device 24 is controlled by controller 190. Controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, performs work of mounting components on a circuit board held by board conveyance device 22. With component mounter 10, it is possible to mount various components to a circuit board; descriptions are given below of a case in which components with leads (hereinafter also referred to as "leaded component") are mounted on a circuit board.

Figure 7:
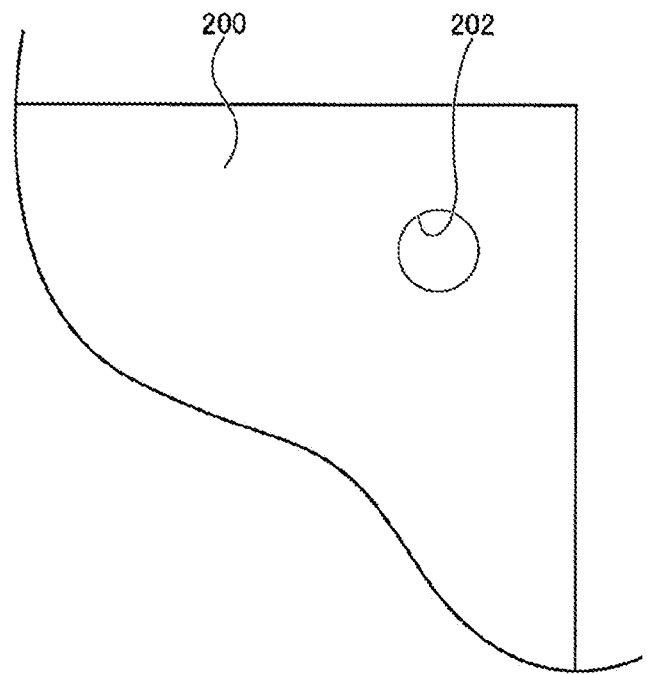
FIG. 7 is a plan view of a through-hole of a board.

Specifically, the circuit board is conveyed to a work position, and is fixedly held at that position by clamp device 46. Next, component camera 26 is moved above the circuit board and images the circuit board. Thus, information is obtained regarding the holding position or the like of the circuit board. In detail, as shown in FIG. 7, fiducial mark 202 is formed in circuit board 200. Fiducial mark 202 is a through-hole that pierces circuit board 200 in a vertical direction, and fiducial mark 202 of circuit board 200 held by clamp device 46 is imaged by mark camera 26. Then, the image data is analyzed by controller 190, and the holding position of circuit board 200 is calculated.

However, in a case in which the color surrounding fiducial mark 202 and the background to be imaged via fiducial mark 202 are the same, the outline of fiducial mark 202 is not clear, and it may not be possible to identify fiducial mark 202 appropriately. In particular, there are many cases in which circuit board 200 is white, and when unit main body 110 of cut and clinch unit 100 is positioned below fiducial mark 202, the shaved metal upper surface of unit main body 110 is imaged as a background via fiducial mark 202, and because the color surrounding fiducial mark 202 and the color of the background of fiducial mark 202 are similar, the outline of fiducial mark 202 may be unclear. Also, when the shaved metal upper surface of unit main body 110 is imaged as a background via fiducial mark 202, the light from the flash used during imaging is reflected by the shaved surface, possibly resulting in the outline of fiducial mark 202 being unclear.

Figure 8:
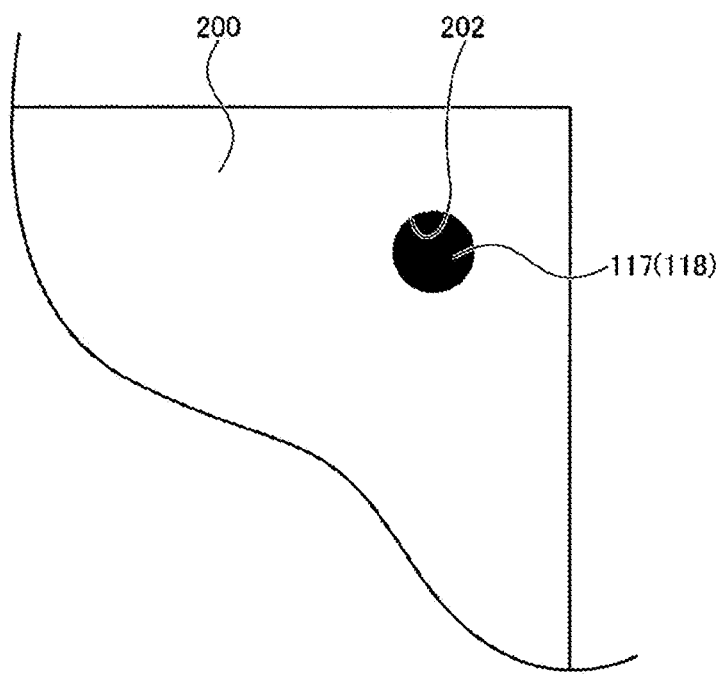
FIG. 8 is a plan view of a through-hole of a board.

Considering these issues, with component mounter 10, when fiducial mark 202 is imaged by mark camera 26, cut and clinch unit 100 is moved by unit moving device 102 such that one of the multiple identification assistance stickers 117 or 118 is positioned as a background to fiducial mark 202. That is, when imaging fiducial mark 202, one of the multiple identification assistance stickers 117 or 118 is moved such that the identification assistance sticker and fiducial mark 202 are positioned along a straight line in the imaging direction of mark camera 26. Thus, as shown in FIG. 8, the background of fiducial mark 202 becomes identification assistance sticker 117 or 118. Identification assistance sticker 117 and 118 are, as described above, black stickers. Therefore, the color surrounding fiducial mark 202 and the color of the background to fiducial mark 202 are opposite, meaning that the outline of fiducial mark 202 is clear. Also, when identification assistance stickers 117 and 118 are imaged as a background via fiducial mark 202, light from the flash used during imaging hardly reflects at all from identification assistance sticker 117 or 118. Thus, it is possible to avoid the outline of fiducial mark 202 being made unclear to due reflected light.

In this manner, with component mounter 10, when imaging fiducial mark 202, by controlling the position of cut and clinch unit 100 such that identification assistance sticker 117 or 118 is positioned as the background to fiducial mark 202, it is possible to appropriately check the holding position of circuit board 200. After recognizing the holding position of circuit board 200, one of the work heads 60 or 62 is moved above the supply position of a component supplied by either component supply device 30 or loose component supply device 32, and a leaded component is picked up by suction nozzle 66.

Continuing, work head 60 or 62 holding the leaded component is moved above component camera 28, and the leaded component held by suction nozzle 66 is imaged by component camera 28. Accordingly, information related to the holding position of the component is obtained. Continuing, work head 60 or 62 holding the leaded component is moved above circuit board 200, correction is performed for the error in the holding position of circuit board 200, and correction is performed for the error in the holding position of the component and so on. Then, the leads of the leaded component held by suction nozzle 66 are inserted into through-holes formed in circuit board 200. Here, cut and clinch unit 100 is moved below circuit board 200. Note that, cut and clinch unit 100 is moved such that the coordinates in the XY directions of second through-hole 136 of movable section 122 match the coordinates in the XY directions of the through-hole of circuit board 200.

Then, when the leads of the leaded component held by suction nozzle 66 are inserted into the through-holes of circuit board 200, the tip section of the leads is inserted into the first insertion hole of main body section 120 through second insertion hole 136 of movable section 122 of cut and clinch unit 100. Next, when the tip section of the lead has been inserted into the first insertion hole of main body section 120, movable section 122 is slid with respect to main body section 120. Thus, the lead is cut by the fixed blade of the first insertion hole and the movable blade of second insertion-hole 136. Then, the new tip section of the lead formed by the cutting is bent along the upper surface of bent section 133 of movable section 122 in accordance with the sliding of movable section 122. Thus, the leaded component is mounted into circuit board 200 in a state in which the leads are prevented from coming out of the through-holes.

In this manner, with component mounter 10, when imaging fiducial mark 202, by making identification assistance sticker 117 or 118 the background to fiducial mark 202, it is possible to appropriately recognize the holding position of circuit board 200 and to guarantee components are mounted to an appropriate position. Also, with component mounter 10, simply by affixing identification assistance stickers 117 and 118 to an upper surface of the existing cut and clinch unit 100, it is possible to clearly recognize fiducial mark 202, thus being highly effective for a low cost. Further, multiple identification assistance stickers 117 and 118 are affixed to cut and clinch unit 100. Therefore, from the multiple identification assistance stickers 117 and 118, the identification assistance sticker for which the moving distance of cut and clinch unit 100 is shortest can be used as the background for fiducial mark 202.

Note that, as shown in FIG. 6, controller 190 of control device 36 includes imaging 210, moving control section 212, and calculating section 214. Imaging section 210 is a functional section for imaging fiducial mark 202 using mark camera 26. Moving control section 212 is a functional section for moving cut and clinch unit 100 such that identification assistance sticker 117 or 118 is positioned as the background to fiducial mark 202 when fiducial mark 202 is being imaged. Calculating section 214 is a functional section for calculating the holding position of circuit board 200 based on image data of fiducial mark 202.

Component mounter 10 is an example of a work machine. Conveyance device 22 is an example of a conveyance device. Mark camera 26 is an example of an imaging device. Control device 36 is an example of a control device. Cut and clinch unit 100 is an example of a moving body and a board work device. Unit moving device 102 is an example of a moving device. Identification stickers 117 and 118 are examples of a background section. Circuit board 200 is an example of a board. Fiducial mark 202 is an example of a through-hole. Moving control section 212 is an example of a moving control section. Calculating section 214 is an example of a calculating section.

Further, the present disclosure is not limited to the above example embodiments, and various changed or improved methods of embodiment are possible based on the knowledge of someone skilled in the art. Specifically, for example, in an example above, when imaging fiducial mark 202, black identification assistance stickers 117 and 118 are used as a background to fiducial mark 202, but an identification assistance sticker of another color may be used. However, an identification assistance sticker with a color different to the color surrounding fiducial mark 202 must be used, that is, a color different to white must be used. Also, an identification assistance sticker with not just a different color to the color surrounding fiducial mark 202, but also a different transparency, saturation, and the like may be used, that is, an identification assistance sticker with different color characteristics to the color surrounding fiducial mark 202 may be used.

Also, an identification assistance sticker with not just a different color characteristics to the color surrounding fiducial mark 202, but also an identification assistance sticker with different fluorescent characteristics, light reflectance rate, and the like may be used. Further still, as a background to fiducial mark 202, a light source may be used instead of an identification assistance sticker. That is, a light source may be arranged below fiducial mark 202, and when imaging fiducial mark 202, light may be emitted upwards from below fiducial mark 202 such that the outline of fiducial mark 202 becomes clear. That is, the outline of fiducial mark 202 is made clear by using a background section with different optical characteristics to those surrounding fiducial mark 202 as a background to fiducial mark 202.

Also, when using a background section with different optical characteristics to those surrounding fiducial mark 202 as a background to fiducial mark 202, the optical characteristics may be changeable. That is, for example, a display panel may be used as a background to fiducial mark 202, and a color different to the color surrounding fiducial mark 202 may be displayed on the display panel. Specifically, for example, in a case in which the color surrounding fiducial mark 202 is white, a black screen may be displayed on the display panel, and in a case in which the color surrounding fiducial mark 202 is black, a white screen may be displayed on the display panel.

Also, in an embodiment above, identification assistance stickers 117 and 118 functioning as a background section are provided on cut and clinch unit 100, but the background section may be provided on various devices, so long as the device is able to move any given position below conveyance device 22. Specifically, for example, a background section may be provided on a flow device for flowing molten solder, or the like.

REFERENCE SIGNS LIST

10: component mounter (work machine); 22: conveyance device; 26: mark camera (imaging device); 36: control device; 100: cut and clinch unit (moving body) (board work device); 102: unit moving device (moving device); 117: identification assistance sticker (background section); 118: identification assistance sticker (background section); 200: circuit board (board); 202: fiducial mark (through-hole); 212: moving control section; 214: calculating section

The invention claimed is:
1. A component mounting machine comprising:
a conveyance device configured to convey a board in which a through-hole is formed, the conveyance device including a rail and a conveyor belt;
a camera configured to image from above the board conveyed by the conveyance device;
a moving body arranged below the board conveyed by the conveyance device;
an identification assistance sticker arranged on the moving body;
a moving device configured to move the moving body to a given position; and
a control device including
a movement control section configured to cause the moving device to move the moving body such that the identification assistance sticker arranged on the moving body is arranged as a background to the through-hole, when the through-hole of the board is imaged by the camera, and
a calculating section configured to calculate a position of the board conveyed by the conveyance device based on image data of the through-hole of the board imaged by the camera.
2. The component mounting machine according to claim 1, wherein the moving body is a board work device configured to perform work on the board conveyed by the conveyance device.

3. The component mounting machine according to claim 1, wherein
the identification assistance sticker presents a contrasting color to a color surrounding the through-hole of the board conveyed by the conveyance device.

4. The component mounting machine according to claim 1, wherein
the identification assistance sticker is arranged at multiple locations on the moving body.

5. The component mounting machine according to claim 1, wherein
the identification assistance sticker has changeable optical characteristics.

6. The component mounting machine according to claim 1, wherein
the identification assistance sticker is a black sticker.

* * * * *